Aug. 24, 1965 G. J. KAHAN 3,201,850

METHOD FOR EFFECTING SUPERCONDUCTIVE CONNECTIONS

Filed Jan. 31, 1962

INVENTOR
GEORGE J. KAHAN
BY S. P. Tedesco
ATTORNEY

United States Patent Office 3,201,850
Patented Aug. 24, 1965

3,201,850
METHOD FOR EFFECTING SUPERCONDUCTIVE CONNECTIONS

George J. Kahan, Port Washington, N.Y., assignor to International Business Machines Corporation, New York, N.Y., a corporation of New York
Filed Jan. 31, 1962, Ser. No. 170,003
12 Claims. (Cl. 29—155.5)

This invention relates to cryogenics and, more particularly, to methods and processes for effecting superconducting connections in cryogenic arrays.

Basically, the operation of a cryogenic device or cryotron is based on the physical phenomenon of superconductivity which is that property of certain metals and alloys to exhibit no electrical resistance below a critical temperature. Generally, cryotrons comprise superpositioned control and gate conductors formed of conductive strips of hard and soft superconductive materials, e.g. lead and tin, respectively, arranged in crossover in-line fashion with interpositioned dielectric layers and deposited onto a planar substrate; a plurality of cryotrons are deposited onto such substrate to form a cryogenic array. To facilitate electrical terminal connections to a cryogenic array, selected control and also gate conductors are deposited so as to be electrically integral with "land" structures positioned along the substrate periphery. For example, a cryogenic array and associated "land" structures and certain electrical connections between said "land" structures and utilization circuits and current sources are shown in the John J. Lentz Patent application, Serial No. 809,815, which was filed on April 29, 1959, now Patent 2,966,646. It is evident that electrical connections made to "land" structures should exhibit superconductive properties so as not to introduce resistance and, therefore, heating in the various cryotron circuits. That is particularly important where the particular control and gate conductors electrically integral with such "land" structures are arranged in a "superconductive loop" which is defined as one wherein current flow, once established, is self-sustaining; minute resistance introduced by a connection not exhibiting superconductive properties would be destructive of such operation.

Heretofore, considerable difficulty has been encountered in effecting superconductive connections to "land" structures. Prior art methods having employed well-known soldering processes only slightly modified to adapt them for cryogenic applications. Such soldering processes, however, necessitate the application of a large amount of heat directly to the "land" structure to effect a connection therebetween and, for example, a wire lead or a conductive strip. The application of excessive heat to a cryotron array is extremely undesirable. For example, where metallic substrates are employed, such substrates act as a heat sink whereby the substrate and, therefore, each cryotron supported thereon are raised to the melting point of the particular soldering material employed. Resultant stresses due to differences in coefficients of thermal expansion of metallic substrates, the control and gate conductors, and the interpositioned dielectric layers often rupture and permanently damage the cryogenic array. Also, when glass substrates are employed, resulting strains due to point heating at a "land" structure and subsequent cooling often result in a cracking of the glass substrate. In addition, excessive heating of a cryogenic array during a soldering process causes diffusion of atoms across junctions of hard and soft superconductive materials such that larger magnetic fields are required to switch each such material from a superconductive to a resistive state.

In addition, prior art methods are totally unsuitable for mass production of cryogenic devices. For example, soldering techniques when adapted to cryogenic applications are extremely tedious due to the smallness of structures between which superconductive connections are to be made. Although the "land" structures are of maximum allowable surface area and generally thicker than the gate and control conductors continuous therewith, they are extremely fragile. Unless extreme caution is exercised, the cryogenic array can be accidently damaged by puncture and/or the careless use of fluxes during the soldering process. Such methods, however, continue to be employed as no satisfactory, alternative method has been available prior to this invention.

It is, therefore, an object of this invention to provide an improved method for effecting superconductive connections between "land" structures and, for example, wire leads or conductive strips.

Another object of this invention to provide a method for effecting superconductive connections between "land" structures and, for example, wire leads or conductive strips at substantially room temperature and without the generation of excessive heat.

Another object of this invention is to provide a method for agglomerating particulate superconductive materials so as to form a strip line connection exhibiting superconductive properties.

Another object of this invention is to provide a method for effecting superconductive connections which is suitably adapted for mass production techniques.

These and numerous other objects and advantages are achieved in accordance with this invention by conditioning the surfaces of particles and/or blocks of superconductive materials to form conductive metallic bridges defining area contacts rather than point contacts therebetween such as to effectively integrate such particles and/or blocks. In accordance with one aspect of this invention, superconductive connections are established between the surfaces of particles and/or blocks of superconductive materials without the application of heat by subjecting such materials to the action of a suitable acid-solvent-resin solution. The acid-solvent-resin solution acts to expose clean surfaces of the superconductive materials so as to support the formation of these conductive metallic bridges and also serves as an adhesive to render the superconductive connection thus established durable.

When the acid-solvent-resin solution is applied to the surface of a particle or block of superconductive material, the acid component reacts with the oxide film normally formed thereon to expose thoroughly cleaned surfaces of the material and produces a by-product soluble in the acid-solvent-resin solution. When two such surfaces contact, conductive metallic bonds form therebetween due to the attractive force field of the atoms; such conductive metallic bonds cause such surfaces to adhere one to the other. As the by-products of the cleaning process are soluble, a maximum number of contacts and, therefore, conductive metallic bonds are established between such surfaces. Further, due to what is believed to be an electrolytic mechanism, conductive metallic bridges of the superconductive material tend to form about each conductive metallic bond and thus fill voids between the contacting surfaces so as to define area contacts rather than point contacts therebetween. Therefore, as such surfaces are effectively integrated, such connection exhibits the same superconductive properties as does the superconductive material forming the surfaces. When the acid and solvent components of the solution subsequently evaporate, the resin component hardens as to bind the contacting surfaces.

Further, and in accordance with another aspect of this invention, particles of superconductive material are introduced into the acid-solvent-resin solution which serves as a carrier. While in suspension, the superconductive particles are thoroughly surface-cleaned by the acid component and have a tendency to immediately agglomerate due to the formation of conductive metallic bonds therebetween. However, the resin component is effective to retard the formation of these conductive metallic bonds for a shot time such that the surface-cleaned particles remain in suspension as a pigment. The probability of conductive metallic bonds being formed between the surface-cleaned particles is very high; also, due to a same electrolytic mechanism, metallic bridges tend to form to fill voids between such bonded particles. Therefore, and in accordance with another aspect of this invention, this suspension of surface-cleaned particles are deposited in printed-circuit fashion and, when the acid and solvent components of the solution evaporate, form a continuous strip of concatenated particles exhibiting superconductive properties which are frozen in the hardened resin component.

The foregoing and other objects, features, and advantages of the invention will be apparent from the following more particular description of preferred embodiments of the invention, as illustrated in the accompanying drawings:

Figure 1:
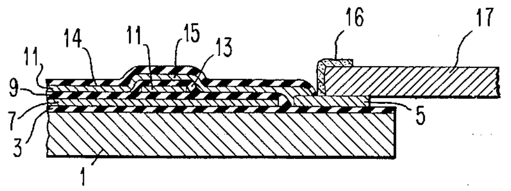
FIGS. 1 and 2 illustrate superconductive connections between "land" structures positioned on a substrate and a wire lead and conductive strip, respectively, formed of similar superconductive materials.
Figure 2:
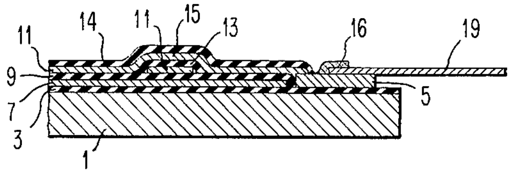
Figure 3:
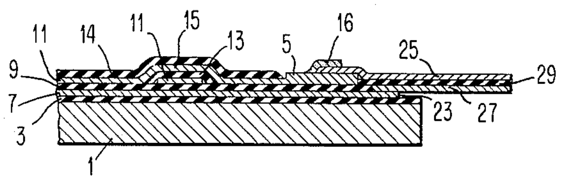
FIG. 3 illustrates a superconductive transmission line connection to a "land" structure supported on a substrate.

The basic structure of a cryotron is illustrated in cross-section in each of FIGS. 1, 2 and 3. The cryotron, as is well known, is formed by the superdeposition through appropriate masking arrangements of layers of selected materials in a high vacuum onto a substrate 1, for example, of aulminum. Initially, an insulating layer 3, for example, of aluminum oxide is deposited over the entire surface of the aluminum substrate 1; "land" structures 5 of hard superconductive material are then deposited in predetermined arrangement along the edge of substrate 1. "Land" structures 5 are deposited with maximum allowable surface area and of maximum thickness to facilitate the establishment of terminal connections thereto. The next step of the fabrication is to evaporate a ground plane 7 of hard superconductive material onto the insulating layer 3 while "land" structures 5 are effectively masked. As is well known, the ground plane 7 acts as a shield to reduce inductances of each of the control and gate conductors forming the cryotron. Thereafter, a second insulating layer 9, for example, of silicon monoxide is deposited over so as to slightly overlap ground plane 7. A thin strip 11 of soft superconductive material forming the gate conductor of the cryotron is then deposited through an appropriate mask onto insulating layer 9. An additional layer of insulating material 13, for example, of silicon monoxide, is deposited over the portion of the gate conductor 11 which is to be traversed in in-line or crossover fashion, the latter being illustrated, by a thin strip 15 of hard superconducting material forming the control conductor of the cryotron. The control conductor 15 extends to and is electrically integral with a particular "land" structure 5. As is well known, only that portion of the gate conductor 11 immediately below control conductor 15 may be formed of soft superconductive material while the remaining portion is formed of hard superconductive material. Although not shown, it is evident that the gate conductor 11, if required, may also be terminated at a "land" structure 5. A protective layer of insulating material 14 is deposited over the gate conductor 11 and control conductor 15.

Figure 4:
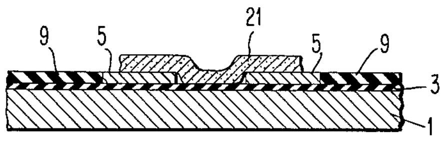
FIG. 4 illustrates a superconductive connection between two "land" structure formed of concatenated particles of superconductive material frozen in a permanent resin binder.

However, as is hereinafter set forth in detail, this invention is particularly directed to the establishment of electrical terminal connections exhibiting superconductive porperties to, for example, "land" structures 5. The selection of a particular one of the electrical connections shown in FIGS. 1 through 4 is determined by circuit considerations obvious to those skilled in the art. For example, superconductive connections illustrated in FIGS. 1 and 2 would be employed for D.C. or low frequency A.C. connections to a "land" structure 5. As shown in each of FIGS. 1 and 2, a wire lead 17 or conductive strip 19, respectively, of hard superconductive material, e.g. lead, is joined in superconductive contact at one end to a "land" structure 5 and connected at the other end, for example, to a utilization circuit, not shown. An alternate type D.C. or low frequency A.C. connection is shown in FIG. 4 wherein superconductive connection is effected between "land" structures 5, for example, supported on a same substrate 1 along a strip connection 21 formed of concatenated particles of hard superconductive material. Heretofore, strip connections similar to that illustrated in FIG. 4 were effected by evaporation/deposition of thin conductive strips through a suitable mask so as to be electrically continuous with each "land" structure 5. A fourth type of connection, generally termed a transmission line connection, illustrated in FIG. 3 would be employed for high frequency A.C. connections to a "land" structure 5. To effect this latter connection, a portion 23 of the ground plane 7 is extended in finger-fashion beyond the insulating layer 9 while the "land" structure 5 continuous with control conductor 11 is positioned from the edge of the insulating layer in step fashion. Parallelly-aligned conductive foils 25 and 27 of hard superconductive material having an interpositioned insulating layer 29 of Mylar are joined in superconductive contact at one end of the portion 23 of ground plane 7 and "land" structure 5, respectively, and connected at the other end, for example, to a utilization circuit, not shown. The lower conductive foil 27, in this instance, serves as an extension of the ground plane 7 to shield upper superconductive foil 25.

The superconductive connections shown in FIGS 1, 2, and 3 are well known and have heretofore been effected by modified soldering techniques. However, superconductive connection shown in FIG. 4, is radically different from any heretofore achieved and can be effected only in accordance with particular aspects of this invention.

While the physical and chemical processes of this invention are not fully understood, the mechanism hereinafter set forth is believed to be that by which superconductive connections as illustrated in FIGS. 1 through 4 are effected. However, it is to be clearly understood that such connections can be established if the process as hereinafter particularly defined is employed. Further, these superconductive connections are effected with minimal heating of and the application of minimal pressure, usually gravity alone is sufficient, to a "land" structure 5 whereby severe limitations of the prior art are overcome. Also, this method can be practiced at room temperature and the only heating of the cryogenic array is that due to chemical and physical processes by which such superconductive connections are established.

Generally, a thin, high resistance oxide film forms over the entire surface of superconductive materials, i.e. base metals, when exposed to atmosphere for a short period of time. To insure a superconductive connection, such oxide film must be completely removed from surfaces to be connected; moreover, the contact between such surfaces, once established, must be durable. Such superconductive connections are established by subjecting contacting surfaces of superconductive materials, i.e. "land" structure 5 and wire lead 17 of FIG. 1, to the action of a chemical solution comprising appropriate acid and solvent components. The solvent component can be considered, for all practical purposes, a diluent. This chemical solution reacts to dissolve the thin oxide films so as to expose bare surfaces of the superconductive materials. When such surfaces are in contact, conductive metallic bonds form therebetween due to the attraction force field of atoms in the surface layers of each. This is somewhat analogous to a "cold weld" effected between chemically cleaned surfaces of a same base metal. In addition, the acid component appears to support an electrolytic action whereby free ions of the superconductive material form metallic bridges about these conductive metallic bonds so as to fill voids between contacting surfaces of the super conductive materials, as hereinafter described. Accordingly, area contacts rather than point contacts are established between contacting surfaces so as to, in effect, integrate such surfaces.

The acid-solvent solution is concurrently effective to dissolve by-products of the surface-cleaning action, i.e. the metal salts formed on reaction of the acid component with the thin oxide films. In the event that such by-products were not dissolved, they would precipitate and remain between the contacting surfaces so as to impede the formation of metallic conductive bonds therebetween and introduce resistance into the connection.

The metallic bonds thus formed between the surfaces of the superconductive materials are fragile and easily severed; such bonds, however, are made durable by the addition of a suitable film-forming, organic resin component to the acid-solvent solution. The resin component should be soluble in and compatible with the acid-solvent solution so as not to precipitate by-products of the cleaning action. The acid and solvent components, being volatile, subsequently evaporate or combine with the resin; the resin component thereupon hardens and froms a permanent binder medium 16 between and over the surfaces so as to maintain the conductive metallic bonds intact. The hardened resin component contains traces of the metal salt by-products of the cleaning action as well as the acid and solvent components.

A thorough cleaning of the surfaces of superconductive materials, i.e. the reaction of the acid components and the metal oxide, and non-precipitation of the by-products of such reaction allow for the formation of a maximum number of conductive metallic bonds and, therefore, metallic bridges so as to provide high current capacity and also low inductance characteristics to an established connection. Further, as the acid-solvent-resin solution is liquid, the surfaces to be connected are protected from oxidation at this time.

When a superconductive connection is to be effected, the surfaces to be joined, e.g. that of the wire lead 17 and "land" structure 5 of FIG. 1, are contacted while the acid-solvent-resin solution is applied thereto. With respect to the joinder of the planar surfaces, as shown in FIG. 2, a drop of the acid-solvent-resin solution is placed on the "land" structure 5 and conductive strip 19 positioned thereon with pressure sufficient to cause the respective surfaces to contact. With respect to the transmission line connection of FIG. 3, a similar procedure is followed with respect to each of conductive foils 25 and 27 and "land" structure 5 and portion 23 of ground plane 7, respectively. Overflow of the acid-solvent-resin solution from between the surfaces of conductive foils 25 and 27 and "land" structure 5 and portion 23 of ground plane 7, respectively, is effective to cement the corresponding end of insulating Mylar layer 29 to insulating layer 9. As the acid-solvent-resin solution is in liquid form, such solution may be applied, for example, by a syringe.

The electrical connector, e.g. wire lead 17 of FIG. 1 or the conductive strips 19 of FIG. 2 or the conductive foils 25 and 27 of FIG. 4, are preferably formed of a same superconductive material, e.g. lead, as are the "land" structure 5. Accordingly, the acid component is selected to react with the lead oxide film so as to form lead salts soluble in the acid-solvent-resin solution. For example, acetic acid can be employed to advantage as it reacts with lead oxide film to form lead acetate or other more complex acetates which are soluble when an alkanol, e.g. methyl alcohol, is employed as the solvent; the methyl alcohol, in addition, serves to dilute the acetic acid so as not to dissolve the lead "land" structures to excess.

Organic resins such as, for example, polyvinyl butyral, polyvinyl acetate, or polyvinyl pyrrolidone when added to the acetic acid-methyl alcohol solution form suitable adhesives to maintain the superconductive connection once established. For example, a solution consisting of two grams of polyvinyl butyral, twenty milliliters of methyl alcohol and .75 milliliter of glacial acetic acid provides a durable superconductive connection betwen lead surfaces, as shown in FIGS. 1, 2 and 3. Each of these resins have film forming characteristics and are soluble in and compatible with the acetic acid-methyl alcohol solution. When the acid-solvent-resin solution is applied, such resins, for example, polyvinyl butyral, initially form a thin outer skin or film through which the acetic acid and methyl alcohol components evaporate in osmotic fashion. For example, it is estimated that at least four hours should be allowed for sufficient quantities of the acetic acid and methyl alcohol components to evaporate to form a durable superconductive connection between lead surfaces. It is evident that such process can be accelerated by a slight heating of the lead surfaces or in a reduced atmosphere. These organic resins, in addition, appear to retard the formation of the conductive metallic bonds and also the electrolytic process by which metallic bridges are formed between the surfaces to insure a thorough cleaning of the lead surfaces by the acetic acid.

For effecting connections between lead "land" structures 5 as shown in FIG. 4, the acid-solvent-resin solution serves as a carrier of particles of superconductive materials. When lead particles or powders, e.g. 40 grams of 200 mesh, are placed in the above-defined solution, for example, of acetic acid, methyl alcohol, and polyvinyl butyral, each particle is immediately subjected to a thorough cleansing action by the acid component whereby oxide-free surfaces are exposed and conductive metallic bonds tend to form between such surfaces on contact. By-products of this cleansing action dissolve in the acetic acid and methyl alcohol components. The formation of these conductive metallic bonds appears to be accelerated due to the irregular surfaces geometry of each particle whereby incremental portions of the respective surfaces are of different energy states. It has been observed that, in the absence of a resin component, i.e. polyvinyl butyral, the cleaned lead particles have a tendency to immediately agglomerate into a solid mass. The presence of a suitable resin in the solution, however, appears to reduce the rate of this agglomeration. One possible explanation of this phenomenon is that the resin component forms thin protective films over the lead particles which only temporarily inhibits the formation of conductive metallic bonds therebetween. Accordingly, for a short period of time, i.e. approximately five minutes, the lead particles remain suspended in the acid-solvent-resin solution as a pigment which can be applied as a paste in the form of a thin strip to and between the lead "land" structures 5 along the insulating layer 3 on substrate 1. For example, a small syringe may be employed for this purpose. The paste, however, must be applied prior to the formation of conductive metallic bonds between the lead particles. A settling of the lead particles appears to overcome the protective film formed by the polyvinyl butyral and also insures the formation of conductive metallic bonds between a maximum number of lead particles. Further, the acid-solvent-resin solution concurrently conditions the surfaces of "land" structures 5 such that metallic conductive bonds are established therebetween and the thoroughly-cleansed lead particles which settle thereon.

In addition, metallic bridges form over the conductive metallic bridges to fill voids between the contacting particles; the mechanism for forming such bridges is thought to be an electrolytic one wherein the driving force is sought in the free surface energy of the material. Accordingly, point contacts are not obtained between lead particles but rather area contacts as in the case where planar surfaces are connected. The provision of area contacts between the concatenated lead particles effectively reduces the resistance of the painted strip interconnecting the "land" structures 5 of FIG. 4. When the acetic acid and methyl alcohol components of the solution evaporate, the lead particles have concatenated and are frozen in the hardened polyvinyl butyral binder to form a durable strip exhibiting superconductive properties.

By varying the percentage composition of the acid-solvent-resin solution, the above-described method can be employed to effect superconductive connections between surfaces of other or different superconductive materials. In such solutions, the acid component should be reactive with oxide or other films formed on surfaces of superconductive materials whereby conductive metallic bonds form on contact therebetween; the solvent component should be effective to dissolve by-products of this reaction; and the resin component should be compatible with such acid and solvent components and form an adhesive between the contacting surfaces of the materials. For example, in the case of tin, superconductive connections as illustrated in FIGS. 1 through 4 can be effected by a solution of oxalyic acid, which reacts with tin oxide to form soluble tin salts, methyl alcohol and polyvinyl butyral.

Also, the percentage composition of the solution is not critical and can be varied in accordance with the condition of the surfaces to be superconductively connected or the particular requirements of such connection. For example, in cases where the superconductive materials are excessively oxidized, the concentration of the acid component can be increased at the expense of the solvent component to insure total reaction with the oxide films. Conversely, to form slightly resistive connections, the concentration of the acid component is decreased such that the oxide film is not completely reacted. As hereinabove indicate, oxide film and/or by-products of the surface-cleansing process remaining between contacting surfaces of the superconductive materials introduces some resistance into the contact. Therefore, the concentration of the acid component in the solution is determinative of the resistance of the connection established between the contacting surfaces of superconductive materials.

While the invention has been particularly shown and described with reference to preferred embodiments thereof, it will be understood by those skilled in the art that various changes in form and details may be made therein without departing from the spirit and scope of the invention.

What is claimed is:

1. A method for forming electrical connections between metallic surfaces comprising the steps of subjecting said surfaces to the action of a solution consisting essentially of a resin, a diluent and an acid reactive with any oxide coating formed thereon to expose clean metallic surfaces, said clean metallic surfaces capable of forming conductive metallic bonds when contacted so as to define an electrical connection, and contacting said exposed metallic surfaces to establish an electrical connection therebetween, said resin hardening upon evaporation of the unreacted acid to form a binder to maintain said metallic surfaces in contact.

2. A method for effecting electrical connections between surfaces of superconductive materials oxidizable when exposed to atmosphere comprising the steps of subjecting surfaces of said superconductive materials to the action of a solution consisting essentially of a resin component, a solvent component and an acid component reactive with oxides of said superconductive materials to form salts soluble in said resin-solvent-acid solution and expose clean surfaces of said superconductive materials, contacting surfaces of said superconductive materials to form conductive metallic bonds therebetween, and allowing said acid component and said solvent component to evaporate, said resin component hardening to form a permanent binder for said surfaces so as to maintain said conductive metallic bonds.

3. A method for effecting superconductive connections between surfaces of superconductive materials comprising the steps of contacting said surfaces to be connected and subjecting said surfaces to the action of an acid-solvent-resin solution, the acid component of said solution being reactive with oxide films normally formed on said surfaces so as to expose clean surfaces of said materials and produce soluble by-products, said clean surfaces capable of forming conductive metallic bonds when contacted so as to define an electrical connection, said solvent component being effective to reduce acid concentration in said solution and operative along with said acid component to dissolve said by-products of said acid reaction, and said resin component being compatible with said acid component and said solvent component so as not to precipitate said by-products and hardening to form a permanent binder upon evaporation of said acid component and said solvent component to maintain said surfaces in contact.

4. A method for effecting electrical connections between surfaces of superconductive materials, said superconductive materials being oxidizable such that oxide films normally form thereover, comprising the steps of contacting said surfaces to be connected and subjecting said surfaces to the action of a solution consisting essentially of an acid component, a solvent component and a resin component, said acid component being reactive with said oxide films to form salts soluble in said acid-solvent-resin solution and expose clean surfaces of said materials, said clean surfaces capable of forming conductive metallic bonds when contacted, said solvent component serving as a diluent to control the degree of cleaning of said surfaces by said acid component, said resin component being soluble in said solution and forming an adhesive binder for said contacting surfaces upon evaporation of said acid component and said solvent component.

5. A method as set forth in claim 4 wherein said acid-solvent-resin solution consists essentially of actic acid, an alkanol and an organic resin and said superconductive material is lead.

6. A method as set forth in claim 4 wherein said acid-solvent-resin solution consists essentially of oxalyic acid an alkanol and an organic resin and said superconductive material is tin.

7. A method for forming a conductive layer exhibiting conductive properties comprising the steps of introducing particles of a conductive material in a suitable acid-solvent-resin solution, the acid component of said solution being reactive with oxides of said material to expose cleaned surfaces of said particles such that said particles tend to agglomerate, said acid component and said solvent component being effective to dissolve by-products of the reaction of said acid component and oxides, said resin being soluble in the acid-solvent solution and compatible therewith so as not to precipitate said by-products, said resin component being operative to retard agglomeration of said particles whereby said particles remain in suspension in said acid-solvent-resin solution, applying said suspension as a layer prior to agglomeration of said particles and allowing said acid component and solvent component to evaporate, said resin forming a permanent binder for said previously agglomerated particles.

8. A method for forming a conductive strip exhibiting superconductive properties, comprising the steps of introducing particles of a superconductive material into a solution consisting essentially of an acid component, a solvent component and a resin component, said particles of material being oxidizable such that oxide films are normally formed over said particles, said acid component being reactive with said oxide films to form a salt soluble in said acid-solvent-resin solution, said resin component being soluble in said solution and effective to retard a normal tendency of said particles to agglomerate whereby said particles remain in suspension in said acid-solvent-resin solution, and applying said suspension as a narrow strip prior to agglomeration of said particles, said resin component forming a permanent binder for said particles upon evaporation of said acid component and said solvent component.

9. A method as set forth in claim 8 wherein conductive metallic bonds are established between said particles on agglomeration and said acid component supports an electrolytic mechanism whereby free ions of said superconductive material deposit over said conductive metallic bonds to fill voids between said particles.

10. A method for forming a conductive layer exhibiting superconductive properties comprising the steps of subjecting particulate materials exhibiting superconductive properties to a thorough cleansing action whereby surfaces of said base material are exposed and conductive metallic bonds tend to form therebetween, placing said particles in suspension in a carrier consisting essentially of volatile components and a resin component soluble therein, said resin component being effective to temporarily retard formation of said conductive metallic bonds, applying said suspension as a layer prior to the formation of said conductive metallic bonds between said particles, said conductive metallic bonds subsequently forming so as to concatenate said particles, and allowing said volatile components to evaporate whereupon said resin component forms a durable binder for said concatenated particles.

11. A method for forming superconductive strip line connections comprising the steps of introducing particulate materials exhibiting superconductive properties as a suspension into a solution consisting essentially of an acid component, a solvent component, and a resin component, said acid component being reactive with oxide films formed over said particles to form a salt soluble in said solution so as to expose thoroughly cleansed surfaces of said particles, the normal tendency of said thoroughly-cleansed particles to agglomerate being inhibited by said resin component whereby said thoroughly-cleansed particles remain in suspension in said solution, applying said suspension prior to agglomeration of said particles in strip line fashion, and allowing said acid and said solvent components to evaporate, said resin forming a durable binder for said agglomerated particles.

12. A method as set forth in claim 11 wherein said acid component supports an electrolytic mechanism wherein free ions of said superconductive material fill voids between said agglomerated particles.

References Cited by the Examiner

UNITED STATES PATENTS 2,632,237 3/53 Miller ______________ 29—155.55

OTHER REFERENCES

"Pressure Welding of Low-Carbon Steels With Theoretical Considerations on the Mechanism of Such Welding" (CR. Austin and W. S. Jeffries), Technical Publication No. 451, The American Institute of Mining and Metallurgical Engineers, February 1932.

JOHN F. CAMPBELL, *Primary Examiner.*